(12) United States Patent
Wakayama (10) Patent No.: US 6,218,713 B1
(45) Date of Patent: *Apr. 17, 2001

(54) LOGICAL CIRCUIT, FLIP-FLOP CIRCUIT AND STORAGE CIRCUIT WITH MULTIVALUED LOGIC

(75) Inventor: Shigetoshi Wakayama, Kawasaki (JP)

(73) Assignee: Fujitsu Limited, Kawaski (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/895,859

(22) Filed: Jul. 17, 1997

(30) Foreign Application Priority Data

Feb. 12, 1997 (JP) .................................. 9-028128

(51) Int. Cl.[7] .................................................. H01L 29/78
(52) U.S. Cl. .................... 257/402; 257/404; 257/391; 257/345; 326/36; 326/58
(58) Field of Search ............... 326/58, 36; 257/404, 257/402, 314, 345, 391

(56) References Cited

U.S. PATENT DOCUMENTS

| | | | |
|---|---|---|---|
| 5,017,817 | * | 5/1991 | Yanakawa ........................ 307/571 |
| 5,576,573 | * | 11/1996 | Su et al. ............................. 257/391 |
| 5,587,668 | * | 12/1996 | Shibata ................................ 326/36 |
| 5,635,749 | * | 6/1997 | Hong .................................. 257/402 |
| 5,786,618 | * | 7/1998 | Wen ................................... 257/404 |

FOREIGN PATENT DOCUMENTS 3-218070 * 9/1991 (JP) ..................................... 257/404

OTHER PUBLICATIONS

Kemerer, IBM TDB vol. 14 No. 4 9/71 "Storage cell . . . Transistors" pp. 1077–1078.*

* cited by examiner

Primary Examiner—Jerome Jackson, Jr.
(74) Attorney, Agent, or Firm—Armstrong Westerman Hattori McLeland & Naughton, LLP (57) ABSTRACT

A logical circuit device has a MOS transistor having a source region, a drain region, a channel region defined between the source region and the drain region, and a gate electrode formed above the channel region, respectively formed on a semiconductor substrate. The amplitude of a voltage applied to the gate electrode necessary for making the channel region conductive is not level throughout the channel region in the width direction. Using such a logical circuit device, flip-flop circuits and storage circuits of a multivalued logic type can be realized.

8 Claims, 6 Drawing Sheets

LOGICAL CIRCUIT, FLIP-FLOP CIRCUIT AND STORAGE CIRCUIT WITH MULTIVALUED LOGIC

This application is based on Japanese Patent Application No. 9-28128 filed on Feb. 12, 1997, the entire contents of which are incorporated herein by reference.

BACKGROUND OF THE INVENTION a) Field of the Invention

The present invention relates to semiconductor logical circuits, flip-flop circuits and storage circuits particularly of a multivalued logic type.

b) Description of the Related Art

Most of conventional semiconductor logical circuits, flip-flop circuits and storage circuits adopt a binary logic. For example, one memory cell of a static RAM of a binary logic type is constituted of six MOS transistors. A storage density of a memory can be increased by reducing an area of a semiconductor substrate occupied by one memory cell.

There is a limit, however, in reducing a memory cell area. It is effective for increasing a storage capacity without reducing a memory cell area to adopt a multivalued logic type.

SUMMARY OF THE INVENTION

It is an object of the present invention to provide semiconductor logical circuits, flip-flop circuits and storage circuits of a multivalued logic type.

It is another object of the present invention to provide a storage circuit device capable of increasing a storage capacity without reducing one memory cell area.

According to one aspect of the present invention, there is provided a logical circuit device comprising a MOS transistor having a source region, a drain region, a channel region defined between the source region and the drain region, and a gate electrode formed above the channel region, respectively formed on a semiconductor substrate, wherein the amplitude of a voltage applied to the gate electrode necessary for making the channel region conductive is not level throughout the channel region in the width direction.

As the voltage applied to the gate electrode is gradually increased, current first flows through a partial region conductive at that voltage of the channel region. As the voltage applied to the gate electrode is further increased, the width of the partial region where current flows is broadened. Since current flows also through the new conductive portion, the increase factor of current becomes large. The input/output characteristics of the MOS transistor take therefore a gently sloped step shape or wave form. A logical circuit of a multilevel logic type can be formed by using a gentle slope portion of the input/output characteristics for each state of multivalued logic levels.

According to another aspect of the present invention, there is provided a flip-flop circuit device comprising: first and second inverter circuits each formed by a three-terminal semiconductor circuit device having one control terminal and two current terminals, current flowing through the two current terminals being controlled by an electric signal applied to the control terminal, and two graphs intersecting at least 5 points or more when the two graphs are superposed, one graph representing the input/output characteristics of the first inverter circuit and the other graph representing an inverse function of the input/output characteristics of the second inverter circuit; and first and second interconnections for inputting output signals from the first and second inverter circuits to the second and first inverter circuits respectively.

According to another aspect of the present invention, there is provided a storage circuit device comprising: first and second inverter circuits each formed by a three-terminal semiconductor circuit device having one control terminal and two current terminals, current flowing through the two current terminals being controlled by an electric signal applied to the control terminal, and two graphs intersecting at least 5 points or more when the two graphs are superposed, one graph representing the input/output characteristics of the first inverter circuit and the other graph representing an inverse function of the input/output characteristics of the second inverter circuit; first and second interconnections for inputting output signals from the first and second inverter circuits to the second and first inverter circuits respectively; a bit line to be applied with an electric signal corresponding to information to be stored; a switching element connected between the second interconnection and the bit line, a conductive state and a non-conductive state of the switching element being selected by an externally applied select signal; and a word line for supplying the select signal to the switching element.

If there are five cross points between the graph representing the input/output characteristics of the first inverter circuit and the graph representing the inverse function of the input/output characteristics of the second inverter circuit, three cross points among the five cross points can be used as stable states. A storage circuit of a three-valued logic type can be obtained by using each stable state for each of multivalued levels.

As described above, a semiconductor logical circuit of a multivalued logic type can be realized by forming two or more regions having different threshold values in the channel region of a MOS transistor. A storage circuit of a multivalued logic type can be realized by a combination of inverter circuits of a multivalued logic type. The storage density can be increased by using a storage circuit of a multivalued logic type.

DETAILED DESCRIPTION OF THE PREFERRED EMBODIMENTS

Figure 1A:
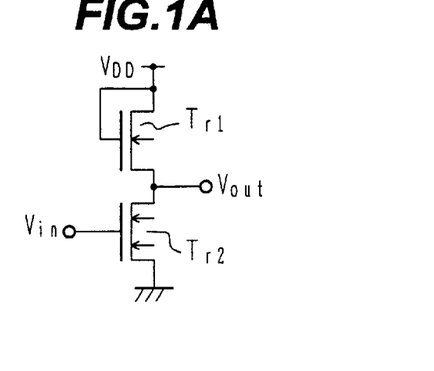
FIG. 1A is an equivalent circuit diagram of an inverter according to an embodiment of the invention.

FIG. 1A shows an inverter circuit according to an embodiment of the invention. The inverter circuit of this embodiment is constituted of a serial circuit of n-channel MOS transistors Tr1 and Tr2. Of this serial circuit, the MOS transistor Tr1 is connected at one of its two current terminals to a power line $V_{DD}$, and the MOS transistor Tr2 is grounded at one of its two current terminals. The gate electrode of the MOS transistor Tr1 is connected to the power line $V_{DD}$. The MOS transistor Tr1 operates as a load of the MOS transistor Tr2. A voltage $V_{in}$ is applied to the gate electrode of the driver MOS transistor Tr2. A voltage $V_{out}$ is output from an interconnection between the MOS transistors Tr1 and Tr2.

Figure 1B:
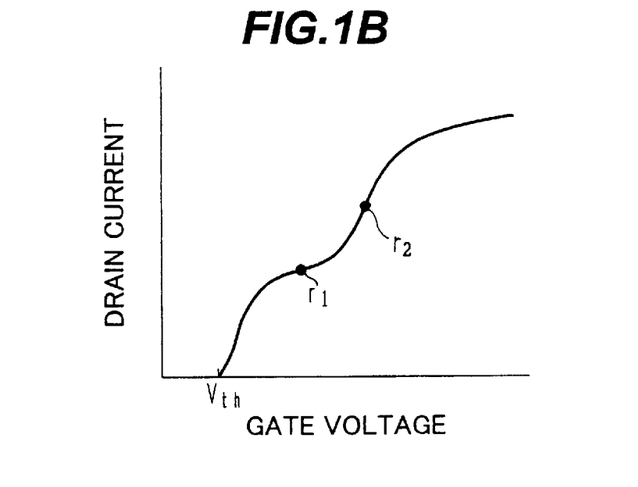
FIG. 1B is a graph showing the input/output characteristics of a driver transistor of the inverter shown in FIG. 1A.

FIG. 1B is a graph showing drain current of the MOS transistor Tr1 as a function of gate voltage. As the gate voltage exceeds the threshold voltage $V_{th}$, the drain current starts flowing, and as the gate voltage continues to rise, the drain current increases. A MOS transistor of a binary logic has no inflection point except extremely near at the threshold voltage $V_{th}$, and as the gate voltage exceeds this single inflection point, the increase factor of the drain current gradually reduces.

In contrast, a MOS transistor of this embodiment shown in FIG. 1B has at least two inflection points r1 and r2 in addition to the inflection point extremely near at the threshold voltage $V_{th}$. At least two bump portions therefore appear on the curve of the input/output characteristics shown in the graph of FIG. 2A. In the drawings of this application, the circuit symbol for such a MOS transistor having the input/output characteristics with at least two bumps is indicated by two arrows added between the drain and source terminals.

Figure 1C:
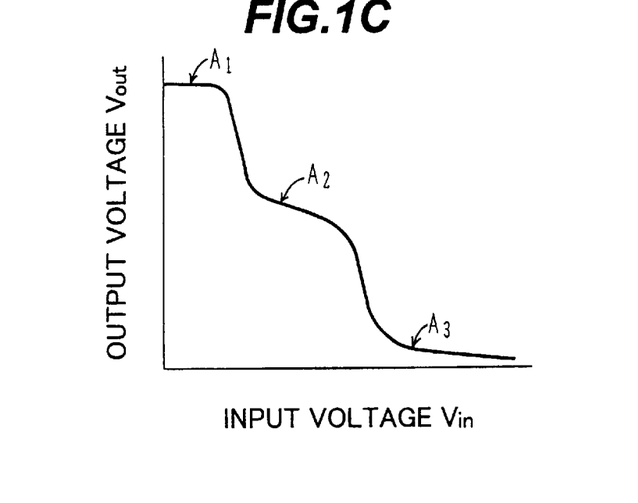
FIG. 1C is a graph showing the input/output characteristics of the inverter shown in FIG. 1A.

FIG. 1C shows an example of the input/output characteristics of the inverter circuit shown in FIG. 1A. The abscissa represents an input voltage $V_{out}$, and the ordinate represents an output voltage $V_{out}$, both in optional scale. Since the MOS transistor Tr2 has two bump portions on the curve of its input/output characteristics, the input/output characteristics of the inverter circuit have corresponding two bumps forming a stepped curve. Therefore, the curve has three regions $A_1$, $A_2$ and $A_3$ of gentle slope. This inverter circuit is a three-valued logic inverter circuit, with the regions $A_1$, $A_2$ and $A_3$ corresponding values 0, 1, and 2.

Next, with reference to FIGS. 2A and 2B, an example of the structure of the driver MOS transistor Tr2 shown in FIG. 1A will be described.

Figure 2A:
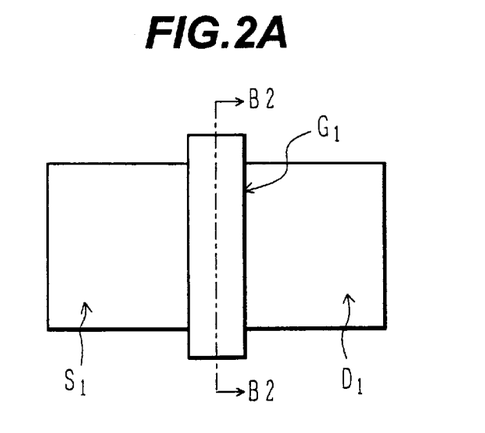
FIG. 2A is a plan view showing an example of the layout of the inverter shown in FIG. 1A.

FIG. 2A is a plan view showing an example of the layout of the driver MOS transistor. On both sides of a gate electrode $G_1$, a source region $S_1$ and a drain region $D_1$ are disposed. The source and drain regions $S_1$ and $D_1$ and a channel region therebetween are surrounded by a field oxide film.

Figure 2B:
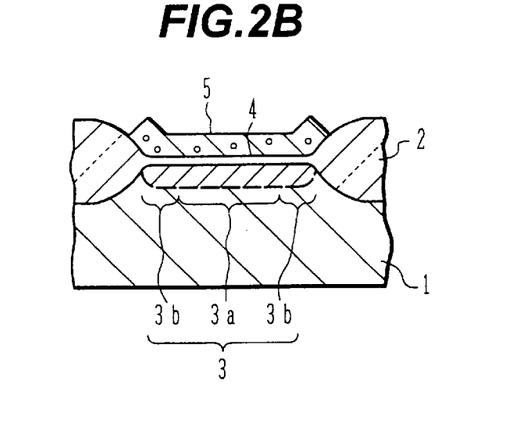
FIG. 2B is a cross sectional view taken along one-dot chain line B2—B2 shown in FIG. 2A.

FIG. 2B is a cross sectional view taken along one-dot chain line B2—B2 shown in FIG. 2A. A field oxide film 2 is formed on the surface of a silicon substrate 1 and defines an active region. A gate oxide film 4 is formed above the channel region of the silicon substrate 1, and a gate electrode 5 made of polysilicon is formed on the gate oxide film 4.

An impurity doped region 3 for controlling the threshold voltage is formed in the surface layer of the channel region. This impurity doped region 3 is constituted of a region 3a at the central area of the channel region in the channel width direction (in the lateral direction in FIG. 2B) where the impurity concentration is high and regions 3b on both sides of the region 3a where the impurity concentration is low. This configuration can be obtained by performing heat treatment after impurities are implanted in the surface layer of the channel region. If the implanted impurities are boron (B) or the like, impurity atoms are absorbed in the field oxide film 2 during heat treatment so that the impurity concentration of the regions 3b near both ends of the impurity implanted region 3 lowers.

The threshold value at the high impurity concentration region 3a is different from that of the low impurity concentration regions 3b. This MOS transistor is therefore expected to have the characteristics similar to the circuit connecting two MOS transistors having different threshold values in parallel. As the gate voltage rises to the threshold voltage $V_{th}$ of one MOS transistor having a lower threshold value, current starts flowing through the channel region having the lower threshold value. As the gate voltage further rises and exceeds the threshold value of the other MOS transistor having a higher threshold value, current starts flowing also through the channel regions having the higher threshold value. As a result, the graph of the input/output characteristics has two bumps.

The MOS transistor shown in FIG. 2B has a channel region, the impurity concentration of which is higher near at the central portion in the width direction and lower on both sides of the central portion. If arsenic or phosphorus are used as an impurity, the impurity in the field oxide film moves into the silicon substrate during heat treatment. Therefore, the impurity concentration near at the central portion 3a is lower than that of both sides 3b of the central region 3a. In this case, the graph of the input/output characteristics also has two bumps.

The impurity concentration of the channel region may be different from that shown in FIG. 2B. If the impurity concentration of the channel region is not level throughout the channel region in the width direction, the graph of the input/output characteristics is expected to have bumps.

Figure 2C:
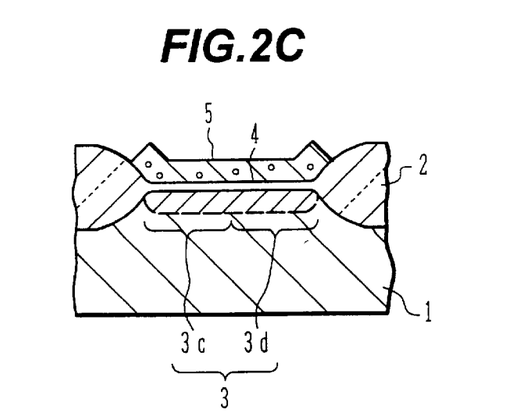
FIG. 2C is a cross sectional view showing another example of the MOS transistor shown in FIG. 2A.

As shown in FIG. 2C, for example, one side portion 3C of the channel region 3 may be higher concentration region and the other side portion 3d may be lower concentration region. The concentration distribution shown in FIG. 2C can be obtained by implanting impurities along an oblique direction using ion implantation. It is preferable that the concentration changes stepwise in order to obtain the graph of the input/output characteristics with obvious bumps.

Next, with reference to FIGS. 3A and 3B, another structure of the MOS transistor Tr2 shown in FIG. 1A will be described.

Figure 3A:
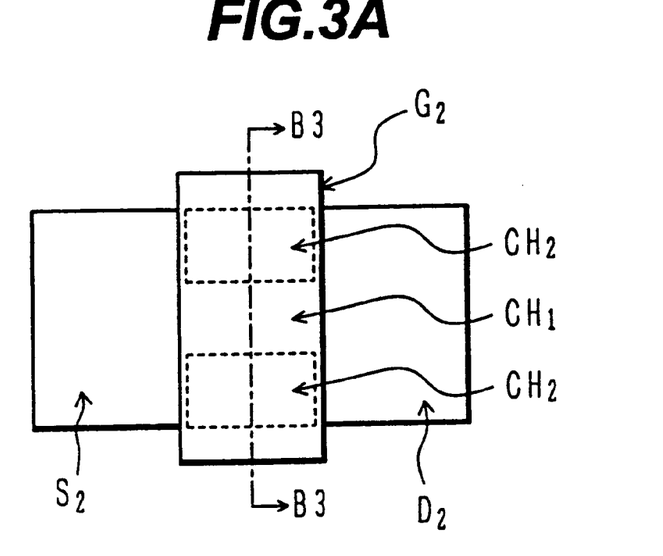
FIG. 3A is a plan view showing another example of the layout of the inverter shown in FIG. 1A.

FIG. 3A is a plan view showing the layout of the driver MOS transistor of this example. On both sides of a gate electrode $G_2$, a source region $S_2$ and a drain region $D_2$ are disposed. A channel region between the source and drain regions $S_2$ and $D_2$ is constituted of a region $CH_1$ at generally the central area of the channel region in the channel width direction where the gate oxide film is thin and regions $CH_2$ on both sides of the region $CH_1$ where the gate oxide film is thick. The gate oxide film above the regions $CH_2$ is formed, for example, at the same time when selective oxidation is performed for forming the field oxide film.

Figure 3B:
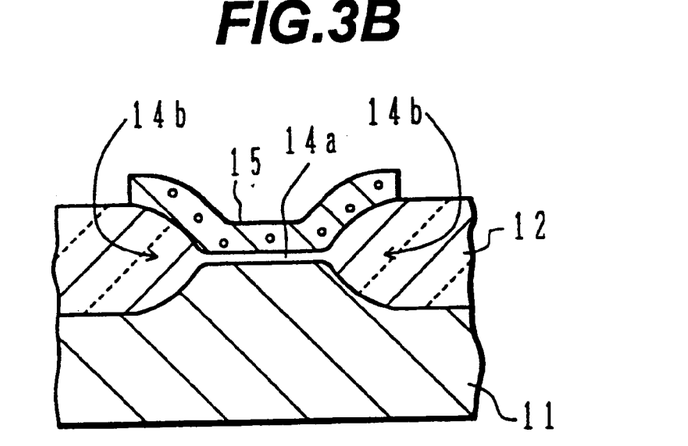
FIG. 3B is a cross sectional view taken along one-dot chain line B3—B3 shown in FIG. 3A.

FIG. 3B is a cross sectional view taken along one-dot chain line B3—B3 shown in FIG. 3A. A field oxide film 12 is formed on the surface of a silicon substrate 11 and defines an active region. A portion of the field oxide film 12 near the boundary to the active region functions as thick gate oxide films 14b. A thin gate oxide film 14a is formed at the area between the thick gate oxide films 14b. On the thin and thick gate oxide films 14a and 14b, a gate electrode 15 made of polysilicon is formed.

The threshold voltage of a MOS transistor changes with the thickness of the gate oxide film. The threshold value at the thin gate oxide film 14a is different from that at the thick gate oxide films 14b. Therefore, the MOS transistor having the structure shown in FIGS. 3A and 3B also has the input/output characteristics with two bumps such as shown in FIG. 1B, similar to the MOS transistor shown in FIGS. 2A and 2B. In order to form clear and separate two bumps, it is preferable to set the total width of the thick gate oxide films 14b to about one fourth to five times of the width of the thin gate oxide film.

Figure 4A:
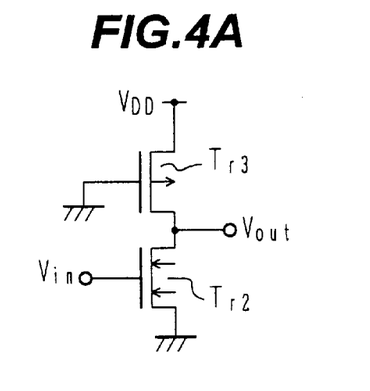
FIGS. 4A to 4C and 5A to 5C are equivalent circuit diagrams of inverters according to other embodiments of the invention.
Figure 4B:
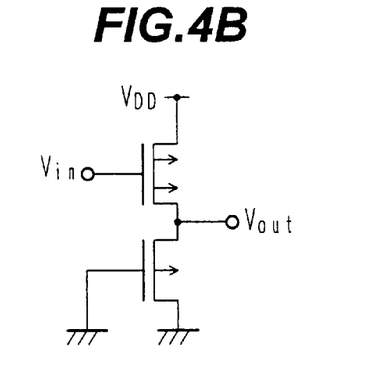
Figure 4C:
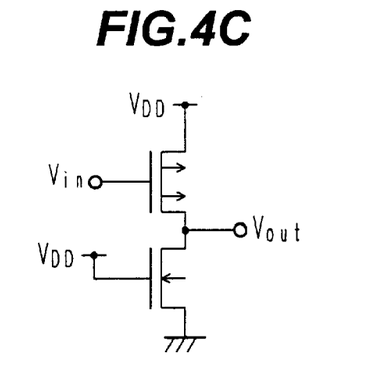

FIGS. 4A to 4C show modifications of the inverter circuit shown in FIG. 1A. The inverter circuit of FIG. 4A uses a p-channel MOS transistor Tr3 in place of the MOS transistor Tr1 shown in FIG. 1A. The inverter circuit of FIG. 4B has two MOS transistors whose conductivity types are opposite to those shown in FIG. 1A. The inverter circuit of FIG. 4C has two MOS transistors whose conductivity types are opposite to those shown in FIG. 4A. Similar to the inverter circuit shown in FIG. 1A, the inverter circuits shown in FIGS. 4A to 4C are expected to have the input/output characteristics with steps of gentle slope similar to the characteristics shown in FIG. 1C.

Figure 5A:
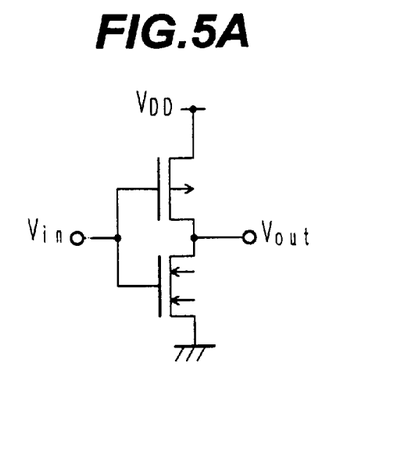
Figure 5B:
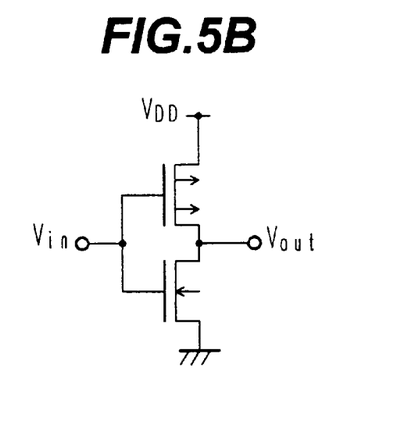
Figure 5C:
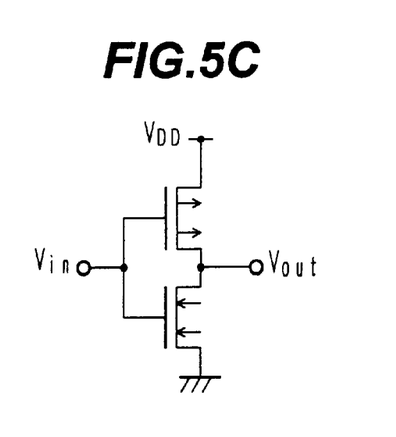

FIGS. 5A to 5C show other modifications of the inverter circuit shown in FIG. 1A. In FIGS. 5A and 5B, n- and p-channel MOS transistors of a CMOS inverter use the load transistor and the transistor having the input/output characteristics shown in FIG. 1B. Also in this case, similar to the inverter circuit shown in FIG. 1A, the CMOS inverter is expected to have the input/output characteristics with steps of gentle slope similar to the characteristics shown in FIG. 1C.

The CMOS inverter shown in FIG. 5C uses the transistor having the input/output characteristics shown in FIG. 1B as its two MOS transistors. It is expected in this case that the input/output characteristics of the two MOS transistors are influenced each other to obtain the input/output characteristics with two or more steps of gentle slope.

Next, with reference to FIGS. 6A and 6B, the structure and operational basics of an SRAM memory cell using the embodiment inverter circuit will be described.

Figure 6A:
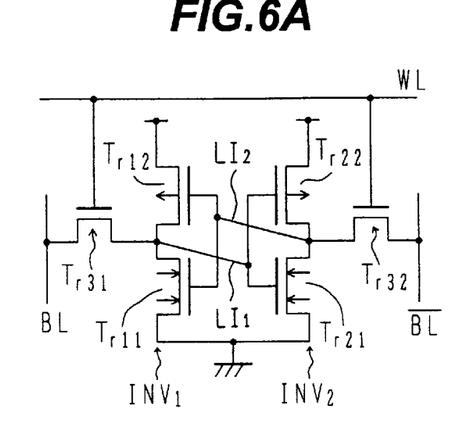
FIG. 6A is an equivalent circuit diagram of a memory cell according to an embodiment of the invention.

The inverter circuits $INV_1$ and $INV_2$ shown in FIG. 6A have the characteristics similar to those of the CMOS inverter circuit shown in FIG. 5A. The inverter circuit $INV_1$ is formed of an n-channel driver transistor $Tr_{11}$ and a p-channel load transistor $Tr_{12}$, whereas the inverter circuit $INV_2$ is formed of an n-channel driver transistor $Tr_{21}$ and a p-channel load transistor $Tr_{22}$.

An output of the inverter circuit $INV_1$ is input via an interconnection $LI_1$ to the inverter circuit $INV_2$, and an output of the inverter circuit $INV_2$ is input via an interconnection $LI_2$ to the inverter circuit $INV_1$. An output terminal of the inverter circuit $INV_1$ is connected via a transfer transistor $Tr_{31}$ to a bit line BL, and an output terminal of the inverter circuit $INV_2$ is connected via a transfer transistor $Tr_{32}$ to an inverted bit line (−BL). The gate electrodes of the transfer transistors $Tr_{31}$ and $Tr_{32}$ are connected to a word line WL.

The memory cell shown in FIG. 6A was actually formed and the characteristics thereof were measured. The gate width of the driver transistors $Tr_{11}$ and $Tr_{21}$ was 0.6 μm, the gate width of the load transistors $Tr_{12}$ and $Tr_{22}$ was 0.2 μm, and the gate width of the transfer transistors $Tr_{31}$ and $Tr_{32}$ was 0.5 μm.

The process conditions of the driver transistors $Tr_{11}$ and $Tr_{21}$ will be described briefly in the following. $B^+$ ions for forming a p-type well were implanted at an acceleration energy of 200 keV and a dose of $2\times10^{13}$ cm$^{-2}$, and $B^+$ ions for cutting a channel were implanted at an acceleration energy of 80 keV and a dose of $2\times10^{12}$ cm$^{-2}$. After ions for channel cut were implanted, annealing was executed for 30 minutes at 950° C.

$B^+$ ions for controlling a threshold value were implanted at an acceleration energy of 40 keV and a dose of $2\times10^{12}$ cm$^{-2}$. The oxidation temperature for forming the gate oxide film was 800° C., and the thickness of the gate oxide film was 4 nm. $As^+$ ions for forming a lightly doped drain structure were implanted at an acceleration energy of 10 keV and a dose of $4\times10^{13}$ cm$^{-2}$, and $As^+$ ions for forming source/drain regions were implanted at an acceleration energy of 40 keV and a dose of $6\times10^{15}$ cm$^{-2}$. Annealing for activation after ion implantation was executed for 10 seconds at 1000° C.

Next, the process conditions of the load transistors $Tr_{12}$ and $Tr_{22}$ will be described briefly in the following. $P^+$ ions for forming an n-type well were implanted at an acceleration energy of 400 keV and a dose of $2\times10^{13}$ cm$^{-2}$, and $P^+$ ions for cutting a channel were implanted at an acceleration energy of 200 keV and a dose of $4\times10^{12}$ cm$^{-2}$. After ions for channel cut were implanted, annealing was executed for 30 minutes at 950° C.

$As^+$ ions for controlling a threshold value were implanted at an acceleration energy of 180 keV and a dose of $8\times10^{12}$ cm$^{-2}$. The oxidation temperature for forming the gate oxide film was 800° C., and the thickness of the gate oxide film was 4 nm. $BF_2^+$ ions for forming a lightly doped drain structure were implanted at an acceleration energy of 10 keV and a dose of $1\times10^{15}$ cm$^{-2}$, and $BF_2^+$ ions for forming source/drain regions were implanted at an acceleration energy of 20 keV and a dose of $2\times10^{15}$ cm$^{-2}$. Annealing for activation after ion implantation was executed for 10 seconds at 1000° C.

Figure 6B:
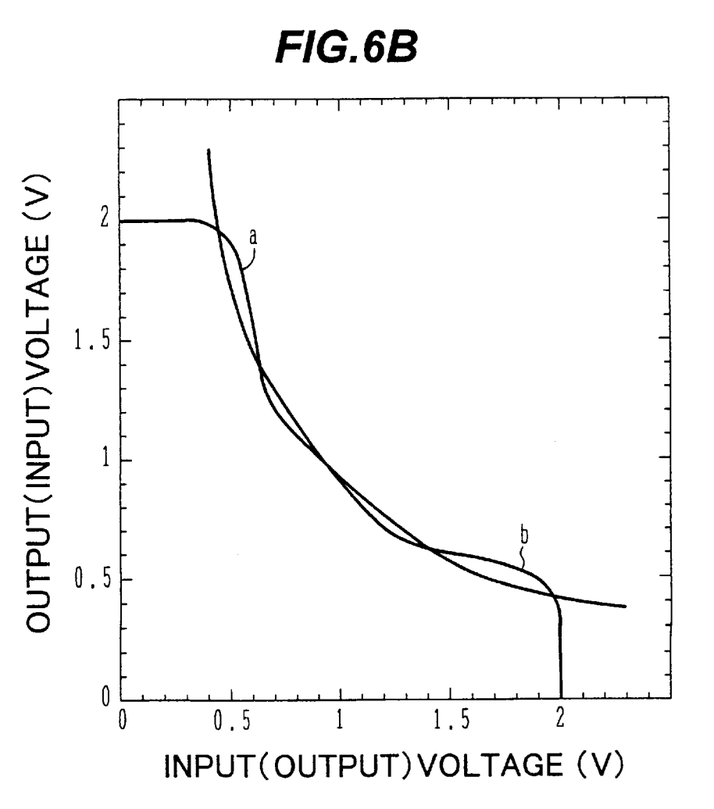
FIG. 6B is a graph showing the characteristics of normal and inverse input/output functions of an inverter of the memory cell shown in FIG. 6A.

FIG. 6B shows the measurement results of the input/output characteristics of the memory cell shown in FIG. 6A manufactured under the above-described process conditions. A curve a shows the input/output characteristics of the inverter circuit $INV_1$, and a curve b shows the inverse function of the input/output characteristics of the inverter circuit $INV_2$. The abscissa and ordinate represent voltage in the unit of V. The supply voltage was 2 V.

Although the curve a does not clearly show two bumps, the negative slope thereof becomes gentle in the region of the input voltage in excess of about 0.6 V, which provides the characteristics similar to the graph of FIG. 1C. The curve b shows the characteristics of the curve a with its abscissa and ordinate being interchanged. The curves a and b cross at five points. Of these five cross points, the points at opposite ends and a center are stable points. Namely, this memory cell has three stable states at the outputs of the inverter circuit $INV_2$ of about 0.45 V, 0.95 V and 1.95 V. This memory cell can therefore store three-valued logic information.

As above, even if the input/output characteristics of a MOS transistor and an inverter circuit constituting a memory cell do not show clear two bumps, the memory cell operates as a multi-valued logic type if the graph of the input/output characteristics of one inverter circuit and the graph of an inverse function of those of the other inverter circuit intersect at five or more points.

The memory cell circuit shown in FIG. 6A is the same as a usual SRAM memory cell circuit, and so the area of the substrate surface occupied by the memory cell is the same. As compared to a binary logic memory cell, this memory cell of a multi-valued logic type can provide a higher storage density.

Although five cross points of the curves a and b are shown in FIG. 6B, the number of cross points may be seven or more. By setting the input/output characteristics of inverter circuits so as to form five or more cross points, information of a multi-valued logic of three or more values can be stored in one memory cell.

Furthermore, although the memory cell shown in FIG. 5A uses inverter circuits shown in FIG. 5A, it may use other inverter circuits such as shown in FIG. 1A, FIGS. 4A to 4C, and FIGS. 5B and 5C.

The present invention has been described in connection with the preferred embodiments. The invention is not limited only to the above embodiments. It is apparent that various modifications, improvements, combinations, and the like can be made by those skilled in the art.

What is claimed is:

1. A flip-flop circuit device comprising:

first and second inverter circuits each formed by a three-terminal semiconductor circuit device having one control terminal and two current terminals, current flowing through the two current terminals being controlled by an electric signal applied to the control terminal;

each of the first and second circuit including a series circuit of load element and a MOS transistor, two ends of the series circuit corresponding to the two current terminals, and the MOS transistor having a source region, a drain region, a channel region defined between the source region and the drain region, and a gate electrode formed above the channel region, the gate electrode connected to the control terminal, the impurity concentration of the channel region being higher near at the central portion of the channel region in the width direction and lower on both sides of the central portion; and first and second interconnections for inputting output signals from the first and second inverter circuits to the second and first inverter circuits respectively;

wherein distribution of the impurity concentration of the channel region of each MOS transistor has a shape so that a first graph representing the input/output characteristics of the first inverter circuit and a second graph representing an inverse function of the input/output characteristics of the second inverter circuit intersect each other at least 5 times when the first graph is superimposed with the second graph.

2. A storage circuit device comprising:

first and second inverter circuits each formed by a three-terminal semiconductor circuit device having one control terminal and two current terminals, current flowing through the two current terminals being controlled by an electric signal applied to the control terminal;

each of the first and second circuit including a series circuit of load element and a MOS transistor, two ends of the series circuit corresponding to the two current terminals, and the MOS transistor having a source region, a drain region, a channel region defined between the source region and the drain region, and a gate electrode formed above the channel region, the gate electrode connected to the control terminal the impurity concentration of the channel region being higher near at the central portion of the channel region in the width direction and lower on both sides of the central portion;

first and second interconnections for inputting output signals from the first and second inverter circuits to the second and first inverter circuits respectively;

a bit line to be applied with an electric signal corresponding to information to be stored;

a switching element connected between the second interconnection and the bit line, a conductive state and a non-conductive state of the switching element being selected by an externally applied select signal; and a word line for supplying the select signal to the switching element;

wherein distribution of the impurity concentration of the channel region of each MOS transistor has a shape so that a first graph representing the input/output characteristics of the first inverter circuit and a second graph representing an inverse function of the input/output characteristics of the second inverter circuit intersect each other at least 5 times when the first graph is superimposed with the second graph.

3. A storage circuit device according to claim 2, further comprising:

an inverted bit line to be applied with an electric signal; and another switching element connected between the first interconnection and the inverted bit line, a conductive state and a non-conductive state of the other switching element being selected by the select signal applied to the word line.

4. A flip-flop circuit device according to claim 1, further comprising:

a bit line to be applied with an electric signal corresponding to information to be stored;

a switching element connected between the second interconnection and the bit line, a conductive state and a non-conductive state of the switching element being selected by an externally applied select signal; and a word line for supplying the select signal to the switching element.

5. A flip-flop circuit device according to claim 4, further comprising:

an inverted bit line to be applied with an electric signal; and another switching element connected between the first interconnection and the inverted bit line, a conductive state and a non-conductive state of the other switching element being selected by the select signal applied to the word line.

6. A flip-flop circuit device comprising:

first and second inverter circuits each formed by a three-terminal semiconductor circuit device having one control terminal and two current terminals, each of the first and second circuit including a series circuit of load element and a MOS transistor, two ends of the series circuit corresponding to the two current terminals, and the MOS transistor having a source region, a drain region, a channel region defined between the source region and the drain region, a gate electrode formed above the channel region, and a gate insulating film sandwiched by the channel region and the gate electrode, the gate electrode connected to the control terminal, the gate insulating film including a first portion having a first thickness and a second portion having a second thickness thicker than the first portion, the first portion and the second portion being arranged in a width direction of the channel region; and first and second interconnections for inputting output signal from the first and second inverter circuits to the second and first inverter circuits respectively, wherein thickness of the first portion and thickness of the second portion are set so that a first graph representing the input/output characteristics of the first inverter circuit and a second graph representing an inverse function of the input/output characteristics of the second inverter circuit intersect each other at least 5 times when the first graph is superimposed with the second graph.

7. A flip-flop circuit device according to claim 6, further comprising:

a bit line to be applied with an electric signal corresponding to information to be stored;

a switching element connected between the second interconnection and the bit line, a conductive state and a non-conductive state of the switching element being selected by an externally applied select signal; and a word line for supplying the select signal to the switching element.

8. A flip-flop circuit device according to claim 6, further comprising:

an inverted bit line to be applied with an electric signal; and another switching element connected between the first interconnection and the inverted bit line, a conductive state and a non-conductive state of the other switching element being selected by the select signal applied to the word line.

* * * * *